United States Patent
Lee et al.

(10) Patent No.: US 7,894,260 B2
(45) Date of Patent: *Feb. 22, 2011

(54) SYNCHRONOUS SEMICONDUCTOR MEMORY DEVICE HAVING ON-DIE TERMINATION CIRCUIT AND ON-DIE TERMINATION METHOD

(75) Inventors: Dong-Jin Lee, Seoul (KR); Kye-Hyun Kyung, Yongin (KR); Chang-Sik Yoo, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 89 days.

This patent is subject to a terminal disclaimer.

(21) Appl. No.: 12/195,516

(22) Filed: Aug. 21, 2008

(65) Prior Publication Data

US 2008/0304334 A1  Dec. 11, 2008

Related U.S. Application Data

(63) Continuation of application No. 11/802,443, filed on May 23, 2007, now Pat. No. 7,426,145, which is a continuation of application No. 10/749,521, filed on Jan. 2, 2004, now Pat. No. 7,239,560.

(30) Foreign Application Priority Data

Jan. 3, 2003  (KR) ............... 2003-0000215

(51) Int. Cl.
*G11C 7/00*  (2006.01)

(52) U.S. Cl. ............... 365/185.05; 365/194; 365/233.1; 326/30

(58) Field of Classification Search ............ 365/189.05, 365/194, 233.1; 326/30
See application file for complete search history.

(56) References Cited

U.S. PATENT DOCUMENTS

| | | | |
|---|---|---|---|
| 5,945,886 A | 8/1999 | Millar | |
| 6,157,206 A | 12/2000 | Taylor et al. | |
| 6,411,122 B1 | 6/2002 | Mughal et al. | |
| 6,414,512 B1 | 7/2002 | Moyer | |
| 6,424,170 B1 | 7/2002 | Raman et al. | |
| 6,571,376 B1 | 5/2003 | Levin et al. | |
| 6,642,740 B2 | 11/2003 | Kim et al. | |
| 6,806,728 B2 | 10/2004 | Nguyen et al. | |
| 6,832,177 B2 | 12/2004 | Khandekar et al. | |
| 7,426,145 B2 * | 9/2008 | Lee et al. ............... | 365/189.05 |
| 2003/0112751 A1 * | 6/2003 | Yuffe et al. ............ | 370/229 |
| 2004/0124874 A1 * | 7/2004 | Kurts et al. ............ | 326/30 |
| 2004/0128429 A1 * | 7/2004 | Khandekar et al. ....... | 711/101 |

FOREIGN PATENT DOCUMENTS

JP  08-204539  9/1996
KR  1020020021450 A  3/2002

* cited by examiner

*Primary Examiner*—Hoai V Ho
(74) *Attorney, Agent, or Firm*—Volentine & Whitt, PLLC

(57) ABSTRACT

A synchronous semiconductor memory device having an on-die termination (ODT) circuit, and an ODT method, satisfy ODT DC and AC parameter specifications and perform an adaptive impedance matching through an external or internal control, by executing an ODT operation synchronized to an external clock. The synchronous semiconductor memory device having a data output circuit for performing a data output operation synchronously to the external clock includes the ODT circuit for generating ODT up and down signals having the same timing as data output up and down signals for the data output operation, to perform the ODT operation.

8 Claims, 6 Drawing Sheets

| PARAMETER/CONDITION | SYMBOL | MIN | NOM | MAX | UNIT |
|---|---|---|---|---|---|
| Rtt(eff) for EMRS(A6,A2)=0,1;75ohm | Rtt1(eff) | 60 | 75 | 90 | ohm |
| Rtt(eff) for EMRS(A6,A2)=1,0;150ohm | Rtt2(eff) | 120 | 150 | 180 | ohm |
| Rtt(mis) | Rtt(mis) | -3.75 | | 3.75 | % |

FIG. 8
| PARAMETER/CONDITION | SYMBOL | MIN | MAX | UNIT |
|---|---|---|---|---|
| ODT turn-on delay | tAOND | 2 | 2 | tCK |
| ODT turn-on | tAON | tAC(min) | tAC(max)+1ns | ns |
| ODT turn-off delay | tAOFD | 2.5 | 2.5 | tCK |
| ODT turn-off | tAOF | tAC(min) | tAC(max)+0.6ns | ns |
FIG. 9
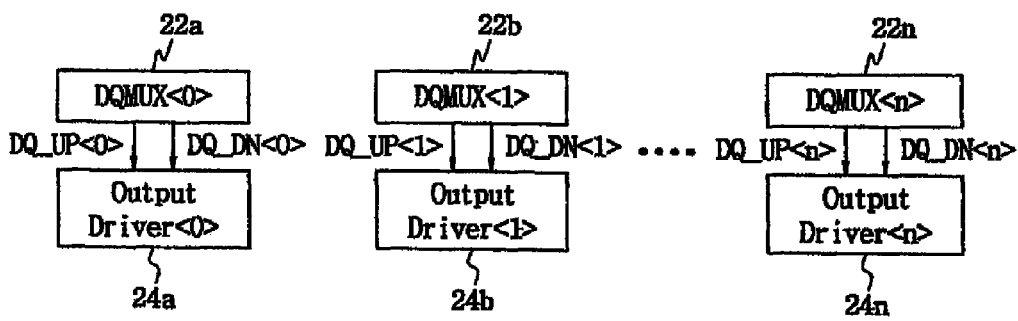
FIG. 10
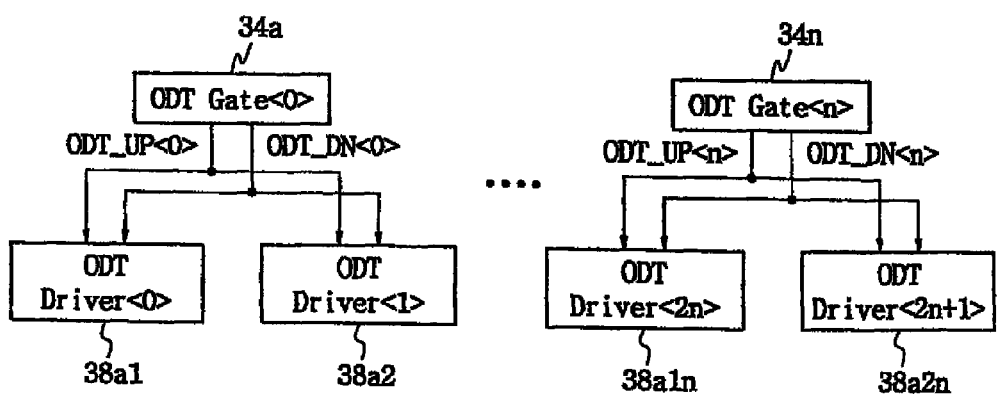

SYNCHRONOUS SEMICONDUCTOR MEMORY DEVICE HAVING ON-DIE TERMINATION CIRCUIT AND ON-DIE TERMINATION METHOD

CROSS REFERENCES TO RELATED APPLICATIONS

This application is a continuation of U.S. patent application Ser. No. 11/802,443, filed on 23 May 2007 and issued as U.S. Pat. No. 7,426,145, which is a continuation of Ser. No. 10/749,521, Jan. 2, 2004, U.S. Pat. No. 7,239,560, issued 3 Jul. 2007, which claims priority under 35 U.S.C. §119 from Korean Patent Application No. 2003-0000215, filed on 3 Jan. 2003, the contents of which are hereby incorporated by reference in their entirety for all purposes as if fully set forth herein.

BACKGROUND AND SUMMARY

1. Technical Field

The present invention relates to a termination of a semiconductor memory device. More particularly, the present invention relates to a synchronous semiconductor memory device having an on-die termination circuit, and an on-die termination method for a synchronous semiconductor memory device.

2. Description

Various kinds of semiconductor devices realized through an integrated circuit chip, such as CPUs, memories and gate arrays etc., are incorporated with one another in various electronic products such as personal computers, servers or workstations. A tendency toward a high-speed operation of such electronic products brings about a small swing width of an interface signal between the semiconductor devices, in order to reduce a delay time taken in a signal transfer. However, such a trend that the swing width of the signal gradually becomes small, has influence upon external noise, and further, a back-echo caused by an impedance mismatch in an interface terminal becomes critical. The impedance mismatch is generated by external noise or a variation of a power voltage, a change of an operating temperature, a change of a manufacturing process, etc. The impedance mismatch can cause a difficulty in a high-speed transmission of data and a distortion in output data. If a distorted output signal is transmitted, a set-up/hold time failure or an error in a decision of an input level, etc., may be often caused at a receiving side.

In particular, the frequency of a signal bus in electronic products employing a dynamic random access memory (DRAM) is being strikingly increased to realize a high-speed operation, and bus termination techniques are being variously researched to reduce a distortion phenomenon against a signal integrity by solving the impedance mismatching problem. As a result of this research, it is known that a system using on-die termination (ODT) is more advantageous from a viewpoint of the signal integrity than a system using a mother board termination (MBT), particularly in an electronic system having a stub bus structure.

One prior art MBT technique is disclosed in U.S. Pat. No. 5,945,886 issued on Aug. 31, 1999 to Millar. One prior art ODT technique is disclosed in U.S. Pat. No. 6,157,206 issued on Dec. 5, 2000 to Taylor et al.

The ODT has such a termination structure that a bus termination is performed at an input/output (I/O) port of a memory equipped with a memory module. That is, the ODT called an on-chip termination is realized by an impedance matching circuit that is employed at a position neighboring to a pad within an integrated circuit chip.

In a semiconductor memory device such as a synchronous DRAM (SDRAM) of a double data rate (DDR) type, etc., a typical ODT for performing an impedance matching is realized by connecting a resistance element having a fixed resistance value to the pad. For instance, if an optional termination circuit is designed to perform a termination operation of 60 ohms, resistance values of resistance elements (Rup,Rdn) constituting the termination circuit are each provided as 120 ohms as shown in FIG. 2.

Such an ODT circuit has only a fixed resistance value, thus has a difficulty to perform various termination operations in conformity to a change of a receiving environment. In other words, when the termination is pre-determined with a default value, an adaptive termination operation is impossible. Further, even though a self-termination circuit for controlling the ODT by itself is equipped internally, it is unnecessary for a semiconductor memory device in which the self-termination circuit is not required, and moreover it is not easy to control a termination resistance by using variable values of various modes through a signal applied from the outside. Furthermore, separate Direct Current (DC) on-die termination parameter and Alternating Current (AC) on-die termination parameter specifications are being recommended in high-speed semiconductor memory devices, thus an ODT countermeasure capable of satisfying such a recommended specification is needed.

Therefore, a high-speed semiconductor memory device requires an adaptive ODT technique capable of definitely satisfying the recommended ODT DC and AC parameter specifications and to perform a termination operation matched to a transmission/reception environment through an external or internal control, by realizing an ODT operation synchronized to an external clock.

Accordingly, it would be desirable to provide an On-die Termination (ODT) operation synchronized to an external clock in a synchronous semiconductor memory device having an ODT circuit, satisfying ODT DC and AC parameter specifications, and performing an adaptive impedance matching through an external or internal control.

It would also be desirable to provide an ODT circuit capable of reducing its occupation area and a power consumption. Still further, it would be desirable to provide a double data rate (DDR) type synchronous semiconductor memory device capable of performing an ODT turn-on and turn-off operation in conformity with an output of data. Accordingly, the present invention is directed to a synchronous semiconductor memory device having an ODT circuit, and an ODT method for a synchronous semiconductor device.

According to one aspect of the present invention, a synchronous semiconductor memory device having a data output circuit for performing a data output operation synchronously to an external clock, includes an ODT circuit for generating ODT up and down signals with the same timing as a generation of data output up and down signals for the data output operation, to thus perform an ODT operation.

The ODT circuit includes an ODT synchronous buffer, an ODT gate and an ODT driver.

The ODT synchronous buffer receives an ODT command applied in response to a buffered clock signal that is generated by buffering an external clock, and then outputs the ODT command in response to a first clock signal delay-locked to the external clock, to thus generate a synchronous ODT command.

The ODT gate passes through and latches the synchronous ODT command in response to the first clock signal and a second clock signal that has a phase difference of a determined level from the first clock signal, to thus generate ODT up and down signals.

The ODT driver performs an ODT driving operation synchronized to the external clock, by controlling on or off operations of a pull-up resistance and a pull-down resistance in response to a state of the ODT up and down signals.

According to another aspect of the present invention, an ODT method in a synchronous semiconductor memory device having a data output circuit for performing a data output operation synchronously to an external clock, includes generating ODT up and down signals at the same timing as a generation of data output up and down signals for the data output operation; and performing an ODT operation corresponding to a state of the ODT up and down signals when an ODT command is applied, to thus control a pull-up and pull-down resistance within drivers for an ODT.

The systematic and methodic configurations of the present invention realize an ODT operation synchronized to an external clock, to satisfy an on-die termination DC and AC parameter specification and perform an adaptive impedance matching through an external or internal control.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 8 illustrates a recommended on-die termination AC parameter specification;

FIG. 9 illustrates a connection between a data output multiplexer and an output driver shown in FIG. 1; and FIG. 10 shows a connection between an ODT gate and an ODT driver shown in FIG. 1.

DETAILED DESCRIPTION

Hereinafter, preferred embodiments of the present invention will be described in detail with reference to the accompanying drawings in which like components having like functions have been provided with like reference symbols and numerals.

It will be understood by those skilled in the art that the present invention can be embodied in numerous different ways and is not limited to the following described embodiments. The following various embodiments are exemplary in nature.

Figure 1:
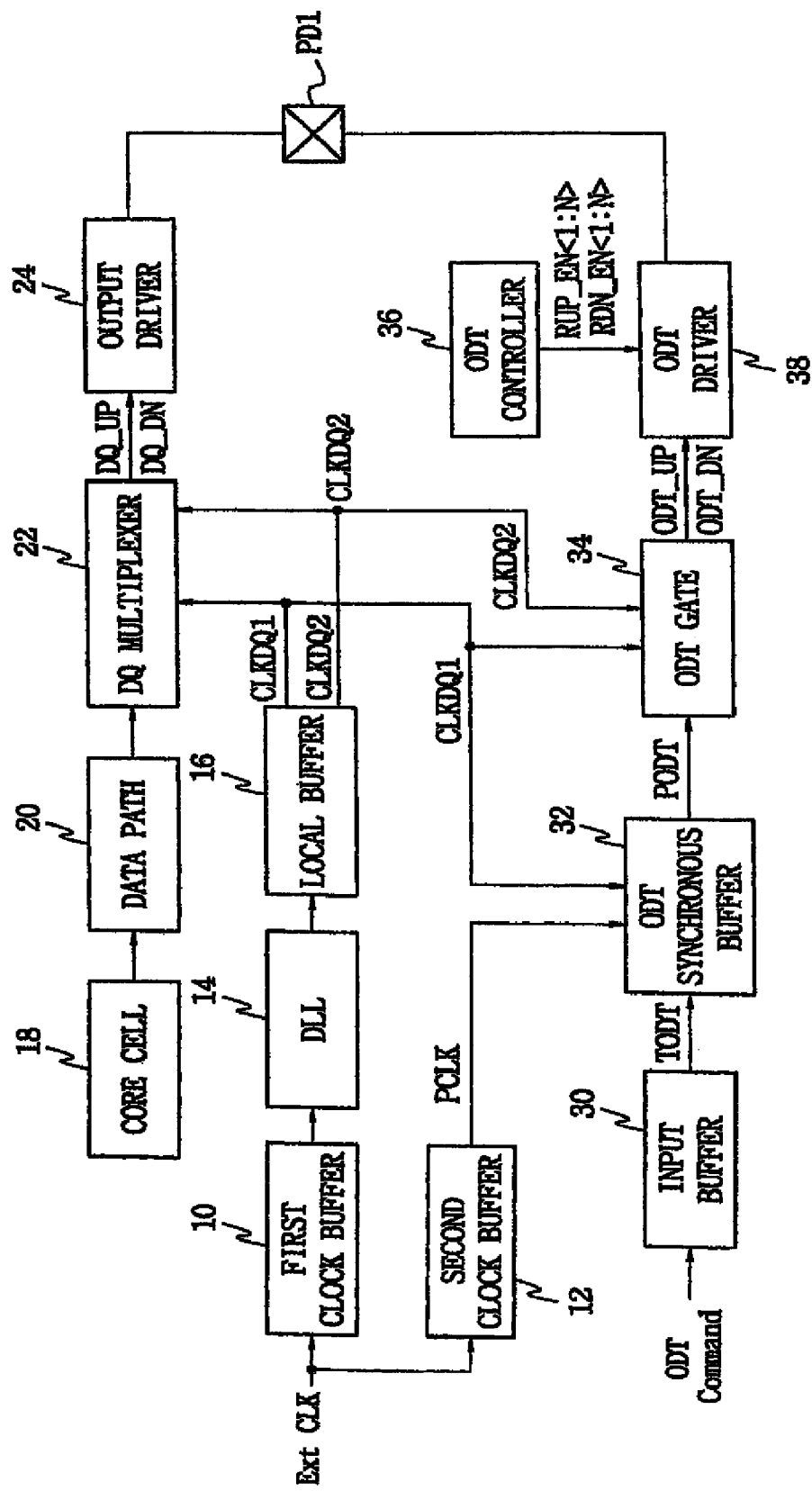
FIG. 1 is a block diagram partially illustrating a synchronous semiconductor memory device having an ODT circuit according to one or more aspects of the present invention.

FIG. 1 is a block diagram partially showing a synchronous semiconductor memory device having an On-die Termination (ODT) circuit. The synchronous semiconductor memory device has a data output circuit that includes a core cell 18, a data path 20, a data output (DQ) multiplexer 22 and an output driver 24, to perform a data output operation synchronously to an external clock Ext CLK. The synchronous semiconductor memory device also has an ODT circuit that includes an input buffer 30, an ODT synchronous buffer 32, an ODT gate 34 and an ODT driver 38. The ODT circuit generates ODT up and down signals ODT_UP, ODT_DN with the same timing as a generation of data output up and down signals DQ_UP, DQ_DN for a data output operation, to perform an ODT operation.

The ODT synchronous buffer 32 receives an ODT command TODT applied in response to a buffered clock signal PCLK generated by buffering the external clock Ext CLK, and outputs the command in response to a first clock signal CLKDQ1 delay-locked to the external clock Ext CLK, to thus generate a synchronous ODT command PODT.

The ODT gate 34 passes through and latches the synchronous ODT command PODT in response to the first clock signal CLKDQ1 and a second clock signal CLKDQ2 having a phase difference of a predetermined or set amount from the first clock signal, to thus generate the ODT up and down signals ODT_UP, ODT_DN.

The ODT driver 38 controls an on or off operation of a pull-up resistance and a pull-down resistance in response to a status of the ODT up and down signals ODT_UP, ODT_DN, to perform an ODT driving operation synchronized to the external clock.

The DQ multiplexer 22 in the data output circuit multiplexes read data applied through the data path 20 by using the first and second clock signals CLKDQ1, CLKDQ2, to generate the data output up and down signals DQ_UP, DQ_DN.

The output driver 24 controls an on or off operation of a pull-up driver and a pull-down driver in response to a state of the data output up and down signals DQ_UP, DQ_DN, to perform the data output operation synchronized to the external clock.

Next, an ODT command path will be described in detail. ODT commands provided from a chipset mostly have an SSTL level. An input buffer 30 receiving the ODT command performs a level conversion operation to output an ODT command TODT having a CMOS level. The TODT is applied to the ODT synchronous buffer 32. The ODT synchronous buffer 32 determines a set-up/hold time of TODT by using PCLK, and then generates an output synchronously to the first clock signal CLKDQ1 as a clock of a Delay Locked Loop (DLL). Thus, a synchronous ODT command PODT is generated from the ODT synchronous buffer 32. The second clock signal CLKDQ2 applied to the ODT gate 34 is a signal obtained by delaying the first clock signal CLKDQ1 by a half cycle of the external clock, and is outputted from a local buffer 16 shown in FIG. 1. That is, the ODT gate 34 passes through and latches PODT by using the first and second clock signals, to generate the ODT up and down signals ODT_UP, ODT_DN for driving the ODT driver 38.

Describing a data output path, cell data stored at the core cell 18 is applied to the DQ multiplexer 22 through the data path 20, then the DQ multiplexer 22 multiplexes the data by using the first and second clock signals CLKDQ1, CLKDQ2, to thus generate the data output up and down signals DQ_UP, DQ_DN. According to a state of the data output up and down signals DQ_UP, DQ_DN, an on or off operation of the pull-up driver and the pull-down driver equipped within the output driver 24 is performed. In other words, data outputted through a pad PD1 connected to an output of the output driver 24 is outputted synchronously to the external clock. The first and second clock signals CLKDQ1,CLKDQ2 are commonly applied to the DQ multiplexer 22 and the ODT gate 34, to enable DQ_UP, DQ_DN and ODT_UP, ODT_DN at the same time, thus the ODT operation is performed in conformity with the data output operation synchronized to the external clock.

That is, when the ODT operation is performed matching to a timing point of the data output, an ODT AC specification is satisfied automatically, and herewith, the output driver 24 and the ODT driver 38 can have a construction of the same type.

First and second clock buffers 10, 12 in FIG. 1 are used for a level conversion of each clock. A DLL 14 is a delay locked loop. The local buffer 16 receives and bypasses an output of the DLL 14, to thus output the first clock signal CLKDQ1, and also delays the output of the DLL 14 by a half cycle of the external clock to produce and output the second clock signal CLKDQ2.

Figure 2:
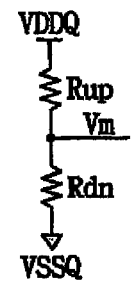
FIG. 2 illustrates a recommended on-die termination DC parameter specification.

FIG. 2 illustrates a recommended ODT DC parameter specification. Referring to FIG. 2, there are an equivalent resistance Rtt(eff) from a viewpoint of a pin, and Rtt(mis) that represents a mismatching extent of an ODT up resistance Rup and an ODT down resistance Rdn, among the ODT DC specifications.

An Rtt effective impedance value is as follows.

$$Rtt(eff) = (VIHac - VILac) / (I(VIHac) - I(VILac))$$
$$= (Rup * Rdn) / (Rup + Rdn)$$
$$= Rup // Rdn$$

Further, an Rtt mismatch between Rup and Rdn is as follows.

$$Rtt(mis)=[(2 \times Vm/VDDQ)-1] \times 100\% = (Rup*Rdn)/(Rup+Rdn) \times 100\%$$

Figure 3:
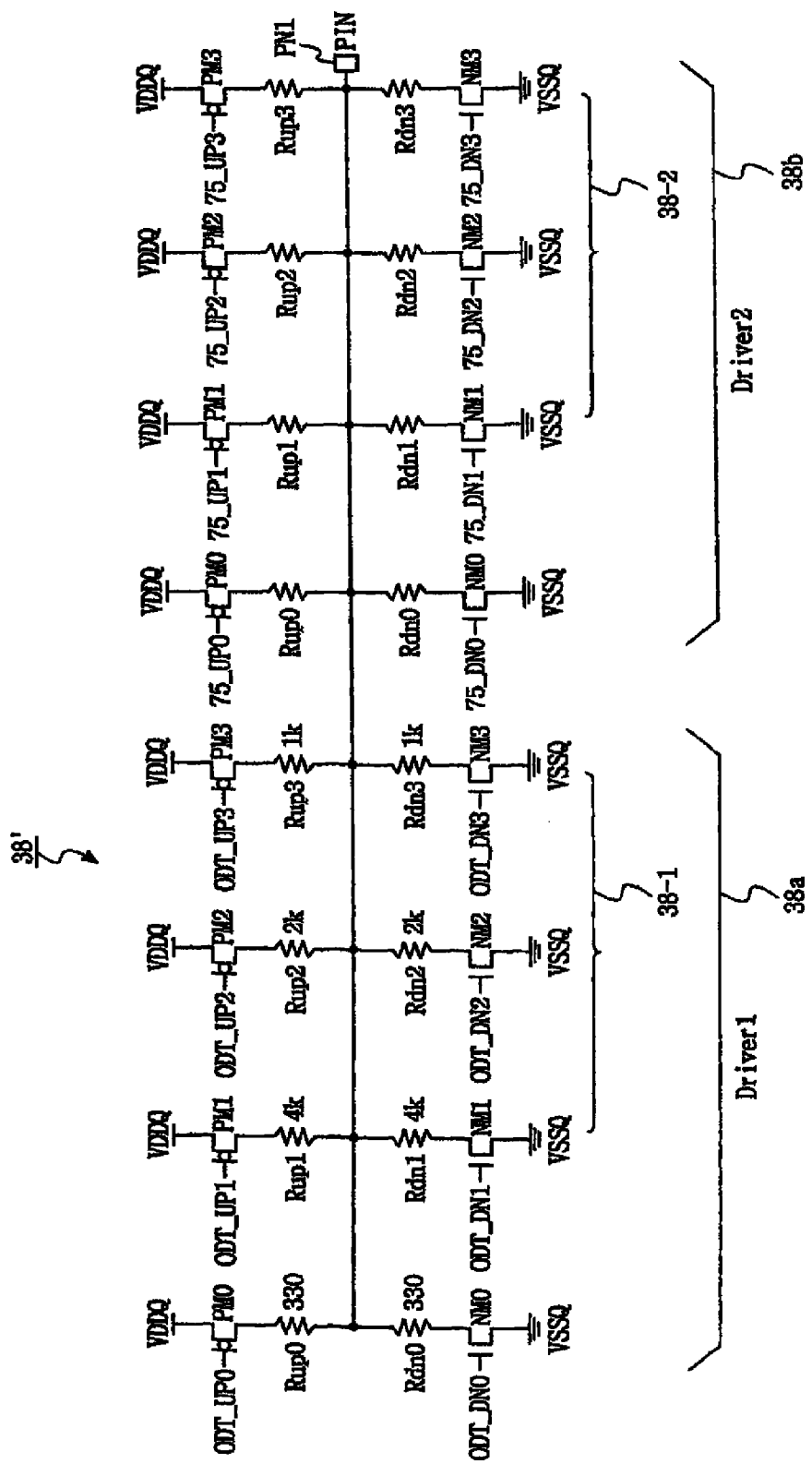
FIG. 3 is a circuit diagram briefly illustrating an example of an ODT driver referred to FIG. 1.

FIG. 3 is a circuit diagram briefly illustrating an example of the ODT driver 38 shown in FIG. 1. Referring to FIG. 3, in the case where Rtt(eff)=150Ω, only a first driver unit 38a is turned on, and if Rtt(eff)=75Ω, both the first driver unit 38a and second driver unit 38b are turned on. ODT_UP0~UP3 and ODT_DN0~DN3 signals shown in FIG. 3 may be signals produced by logically combining the ODT_UP/ODT_DN signals output by the ODT gate 34 of FIG. 1, and the RUP_EN/RDN_EN signals output by an ODT controller 36. ODT_UP0~UP3 are the signals for turning on/off the pull-up resistances Rup0~Rup3 of FIG. 3, and ODT_DN0~DN3 are the signals for turning on/off the pull-down resistances Rdn0~Rdn3. 75_UP0~75_UP3 of FIG. 3 are the signals substantially equal to the ODT_UP0~UP3, but, only in the case where Rtt(eff)=75Ω, are the signals 75_UP0~75_UP3 are enabled. 75_DN0~75DN3 signals are the signals equal to the ODT_DN0~ODT_DN3 signals, and likewise, are enabled only in the case where Rtt(eff)=75Ω. That is, in FIG. 3 the resistances Rup0~Rup3 and Rdn0~Rdn3 in the second driver unit 38b are each correspondingly the same as the resistances Rup0~Rup3 and Rdn0~Rdn3 of the first driver unit 38a, and are enabled only in the case where Rtt(eff)=75Ω. Rup1~Rup3 and Rdn1~Rdn3 in FIG. 3 can be turned on/off by cutting a fuse formed in the ODT controller 36 of FIG. 1 or by applying a mode register set code through the ODT controller 36. Resistance values of Rup1~Rup3 and Rdn1~Rdn3 are disposed by a multiple number of 2 in order of 1 KΩ, 2 KΩ, 4 KΩ, to thus obtain a linear Rtt(eff) characteristic. Also, Rup0~Rup2 and Rdn0~Rdn2 are turned on by default, and Rup3 and Rdn3 are turned off by default.

Whenever there is a process change or a change of a voltage and a temperature etc., the Rtt(eff) value is changed and values of Rup and Rdn become different from each other to make the Rtt(mis) value large. In this case, the Rup and Rdn values can be controlled through a fuse option so as to control the Rtt(eff) value and the Rtt(mis) value. For instance, in Rup of the UP resistance, if Rup0~Rup2 are turned on by default and their actual measured value is larger than a predicted value, Rup3 is turned on through the fuse to thus turn on all Rup0~Rup3, or Rup2 is turned off and Rup3 is turned on to thus turn on Rup0,Rup1,Rup3, accordingly the Rup value can be lowered. Further, in the opposite case, the Rup value can be increased for example by trimming. A similar analysis holds for Rdn.

Figure 4:
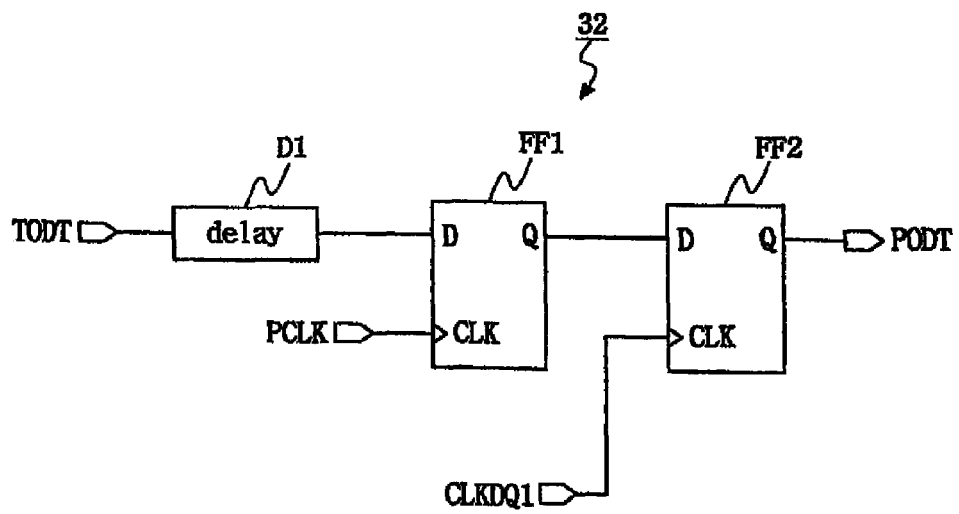
FIG. 4 is a circuit diagram illustrating an exemplary embodiment of an ODT synchronous buffer shown in FIG. 1.

FIG. 4 is a circuit diagram illustrating an exemplary embodiment of the ODT synchronous buffer 32 shown in FIG. 1. Referring to FIG. 4, the ODT synchronous buffer 32 includes a delay D1 for receiving the TODT signal to delay the signal for a given time, a first flip-flop FF1 for latching an output of the delay D1 in response to the buffered clock signal PCLK, and a second flip-flop FF2 for latching a signal received from an output terminal Q of the first flip-flop FF1 in response to the clock signal CLKDQ1, wherein the TODT signal is a signal outputted from the input buffer 30 shown in FIG. 1. Herewith, the input buffer 30 converts a signal level of the ODT command applied with the SSTL level into a CMOS level. The buffered clock signal PCLK is outputted from the second clock buffer 12 for receiving the external clock Ext CLK. The clock signal CLKDQ1 is a DLL locking signal outputted from the local buffer 16. In the ODT synchronous buffer 32, a setup/hold time of the TODT signal is determined by the clock signal PCLK. Then, the TODT signal outputted from the first flip-flop FF1 is transferred to a domain of the clock signal CLKDQ1. That is, the output signal PODT outputted from the second flip-flop FF2 is synchronized to the clock signal CLKDQ1. The first and second flip-flops FF1, FF2 shown in FIG. 4 are D-type flip-flops.

Figure 5:
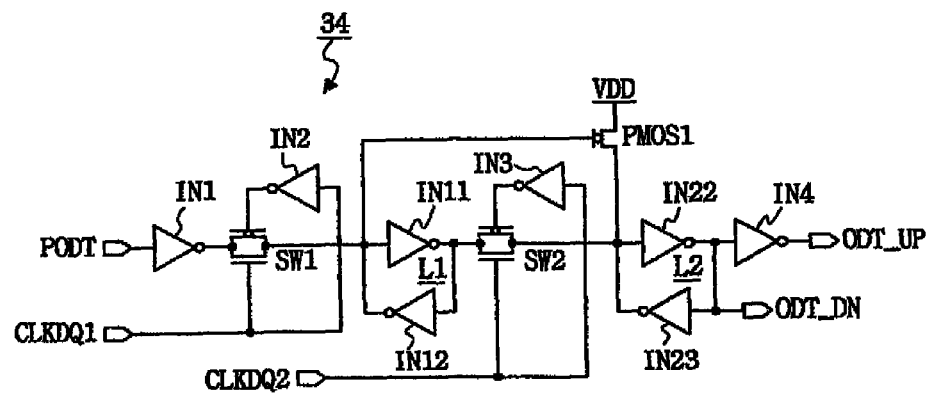
FIG. 5 is a circuit diagram illustrating an exemplary embodiment of an ODT gate shown in FIG. 1.

FIG. 5 is a circuit diagram as an exemplary embodiment of the ODT gate 34 shown in FIG. 1. Referring to FIG. 5, the ODT gate 34 is composed of two transmission switches SW1, SW2, two inverter latches L1,L2, a P-type MOS transistor PMOS1, an input inverter IN1, an output inverter IN4, and inversion-use inverters IN2,IN3 for inverting first and second clock signals CLKDQ1,CLKDQ2. The output signal PODT outputted from the ODT synchronous buffer 32 is applied to the input inverter IN1, and the first and second clock signals CLKDQ1,CLKDQ2 are applied to control terminals of the transmission switches SW1,SW2. The transmission switch SW1 is turned on in response to the first clock signal CLKDQ1 being at a high level, thereby providing an output of the inverter IN1 to the inverter latch L1. Further, the transmission switch SW2 is turned on in response to the second clock signal CLKDQ2 being at a high level, thereby providing an output of the inverter latch L1 to the inverter latch L2. An output from an output terminal of the output inverter IN4 becomes a signal ODT_UP, and an output provided from an output terminal of the inverter IN22 (which is connected to an input terminal of the output inverter IN4) becomes a signal ODT_DN. That is, the signal PODT applied to the ODT gate 34 is synchronized to each of the clock signals CLKDQ1 and CLKDQ2 (which has a phase difference of TC2 from the clock signal CLKDQ1), and is then outputted as up/down signals ODT_UP, ODT_DN for enabling the ODT driver 38.

Figure 6:
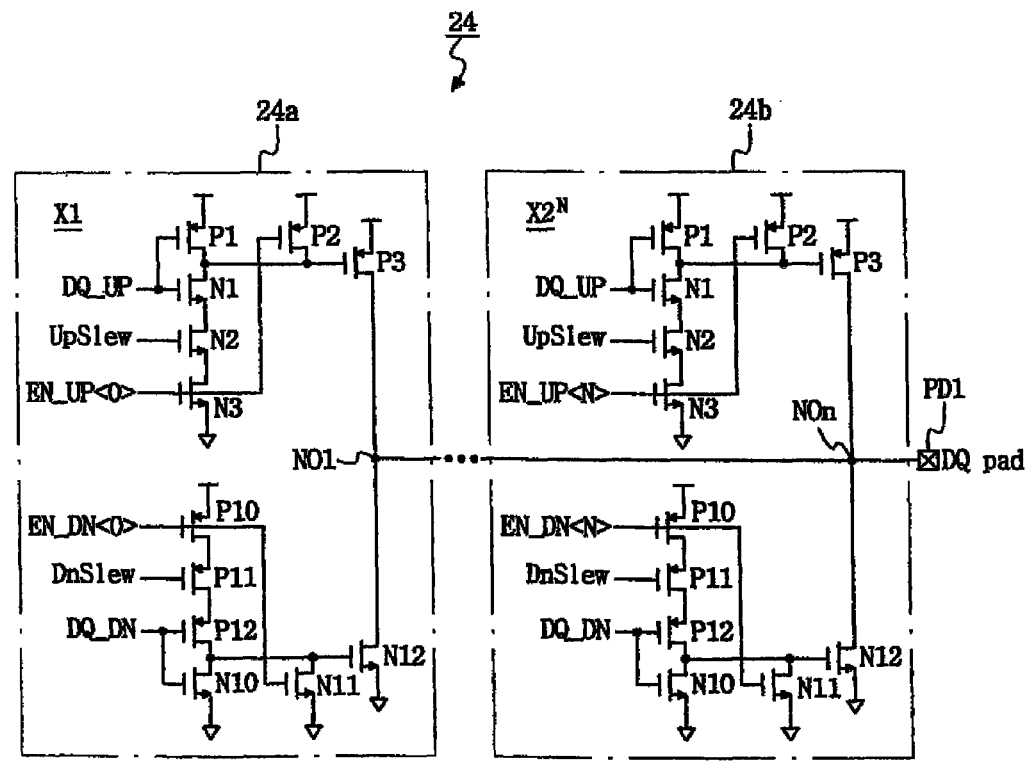
FIG. 6 is a circuit diagram illustrating an exemplary embodiment of an output driver shown in FIG. 1.

FIG. 6 is a circuit diagram as an exemplary embodiment of the output driver 24 referred to in FIG. 1. The output driver 24 includes a plurality of unit output drivers 24a, 24b. One unit output driver 24a is composed of a plurality of P-type and N-type transistors (P1-P3,P10-P12,N1-N3,N10-N12) for pull-up and pull-down operations. Output nodes NO1, NOn of the unit output drivers 24a, 24b shown in FIG. 6 are commonly connected to the output pad PD1.

Figure 7:
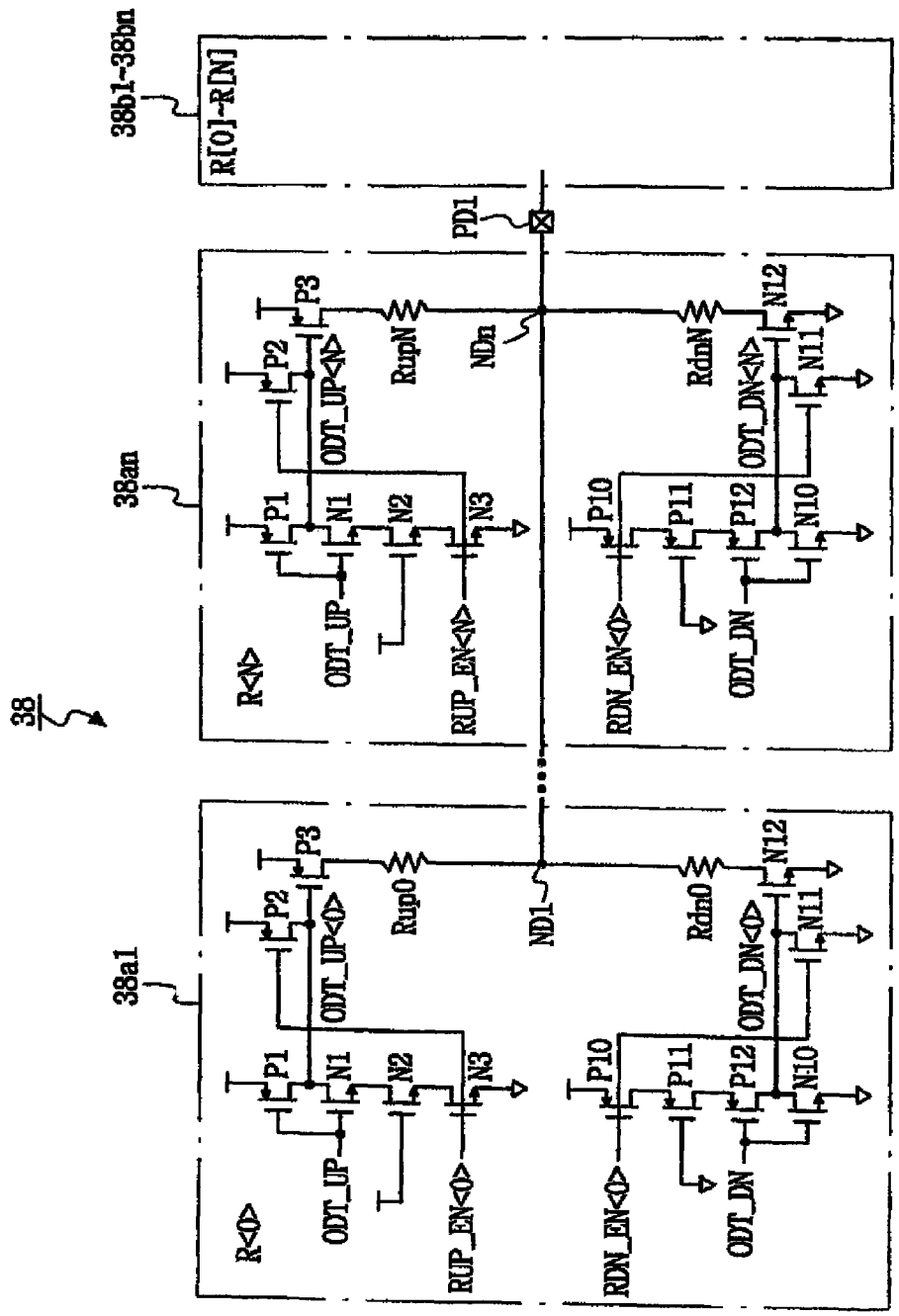
FIG. 7 is a circuit diagram illustrating an exemplary embodiment of an ODT driver shown in FIG. 1.

FIG. 7 is a circuit diagram as an exemplary embodiment of the ODT driver 38 shown FIG. 1. The ODT driver 38 includes a plurality of unit ODT drivers 38a1-38an, 38b1-38bn. One unit ODT driver 38a1 is composed of a plurality of P-type and N-type transistors (P1-P3,P10-P12,N1-N3,N10-N12) for pull-up and pull-down operations, a pull-up resistance Rup0, and a pull-down resistance Rdn0. The P-type and N-type transistors P1,P2,N1-N3 constitute a NAND gate, and the P-type and N-type transistors P10-P12,N10,N11 constitute a NOR gate. Output nodes ND1,NDn in the unit ODT drivers 38a1-38an of FIG. 7 are commonly connected to the output pad PD1. Meanwhile, the plurality of unit ODT drivers 38b1-38bn connected to the output pad PD1 are enabled only in case, e.g., an ODT resistance is 75 ohm.

FIG. 8 illustrates a recommended on-die termination AC parameter specification. The signals ODT_UP, ODT_DN of FIG. 1 have the same delay as the signals DQ_UP, DQ_DN of a normal data path, thus tAON, tAOF among the ODT AC specifications can be satisfied.

FIG. 9 illustrates a connection between the DQ multiplexer 22 and the output driver 24 of FIG. 1, and FIG. 10 shows a connection between the ODT gate and the ODT driver referred to FIG. 1. Sizes of the P-type and N-type MOS transistors P3,N12 within the ODT driver of FIG. 7 can be each provided as about half sizes of the P-type and N-type MOS transistors P3,N12 provided in the output driver of FIG. 6. Therefore, the number of the ODT gates can be reduced to a half, by connecting so that one ODT gate drives two ODT drivers as shown in FIG. 10. Accordingly, a layout area and a power consumption can be reduced.

An operational example of the ODT will be explained with reference to the drawings, as follows.

If the ODT operation must be performed, namely, where the ODT command indicates turning-on the ODT, the ODT command is provided to the input buffer 30, to thus make the output signal PODT of the ODT synchronous buffer 32 a high level. The signal PODT is inverted by the inverter IN1 of the ODT gate 34 shown in FIG. 5, and is then synchronized to the clock signal CLKDQ1 to be outputted as a low level through the transmission switch SW1. At this time, an output of the transmission switch SW1 is at a low level, thus the P-type MOS transistor PMOS1 is turned on. Therefore, because an input of the inverter latch L2 is high and an output thereof is low, the up/down signals ODT_UP, ODT_DN of the ODT gate 34 are outputted as the high and low states, respectively. When the up/down signals ODT_UP, ODT_DN of the ODT gate 34 are outputted in the high and low states, respectively corresponding drivers among the plurality of unit ODT drivers (38a1-38an, 38b1-38bn) of the ODT driver 38 are activated. Herewith, the reason why only corresponding unit ODT drivers are activated, is because the NAND gate and the NOR gate are connected to front ends of the pull-up transistor and the pull-down transistor as shown in FIG. 7. That is, even though the up/down signals ODT_UP, ODT_DN are outputted in the high and low states, respectively; unless the up and down enable signals RUP_EN,RDN_EN of the ODT controller 36 shown in FIG. 1 are applied in the high and low states, respectively, corresponding unit ODT drivers are turned off. That is, various kinds of ODTs can be produced by generating a control signal externally or internally and by selectively driving only required unit ODT drivers.

In the meantime, when the ODT command indicates that the ODT is to be turned off, the signal PODT becomes a low level. The signal PODT is inverted by the inverter IN1 of the ODT gate 34 shown in FIG. 5, and is then synchronized to the clock signal CLKDQ1 and is outputted through the transmission switch SW1. At this time, an output of the transmission switch SW1 has a high level, thus the P-type MOS transistor PMOS1 is turned off. Meanwhile, the inverter latch L1 latches an output of the transmission switch SW1, and outputs a low level. An output of the inverter latch L1 is synchronized to the clock signal CLKDQ2, and is outputted at a low level through the transmission switch SW2. Then, an input of the inverter latch L2 is low and an output thereof is high, therefore the up/down signals ODT_UP, ODT_DN of the ODT gate 34 are outputted in the low and high states, respectively. According to that, the plurality of unit ODT drivers 38a1-38an, 38b1-38bn of the ODT driver 38 are deactivated. That is, in this case, the ODT operation is not performed.

In FIG. 1, the ODT driver 38 is driven by the signals ODT_UP, ODT_DN outputted from the ODT gate 34 synchronously to an output time point of the signals DQ_UP, DQ_DN, therefore the on-die termination DC and AC parameter specifications can be satisfied, and an adaptive impedance matching through an external or internal control can be obtained. Herewith, as was already described in FIGS. 6 and 7, the internal configuration of the output driver 24 and the ODT driver 38 can be desirably provided by the same type of circuit, except for the pull-up and pull-down resistances.

As described above, a synchronous semiconductor memory device having an ODT circuit, and an ODT method, can realize an ODT operation synchronized to an external clock, thereby satisfying ODT DC and AC parameter specifications and performing an adaptive impedance matching through an external or internal control.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. For instance, the ODT circuit may be configured with various types of circuitry. Accordingly, these and other changes and modifications are seen to be within the true spirit and scope of the invention as defined by the appended claims.

What is claimed is:

1. A synchronous semiconductor memory device comprising:
    an on-die termination (ODT) circuit configured to generate ODT up and down signals for performing an ODT operation synchronously to an external clock in response to the ODT up and down signals,
    wherein the on-die termination (ODT) circuit comprises:
        a plurality of unit drivers, wherein each of said unit drivers comprises,
            at least one pull-up resistive element having a first end directly connected to a common node of said unit driver,
            at least one pull-down resistive element having a first end directly connected to the common node of said unit driver,
            at least one pull-up transistor having a drain connected to a second end of the pull-up resistive element, a source connected to a power voltage, and a gate configured to respond to the ODT up signal, and
            at least one pull-down transistor having a drain connected to second end of the pull-down resistive element, a source connected to a ground voltage, and a gate configured to respond to the ODT down signal, wherein the common nodes of the unit drivers are coupled together to an output pad of the device.

2. The device of 1, wherein the ODT circuit comprises an ODT control circuit configured to output an up enable signal and a down enable signal in response to at least one of an external control signal and an internal control signal.

3. The device of 2, wherein the ODT control circuit comprises at least one fuse.

4. The device of 2, wherein the ODT control circuit outputs the up and down enable signals in response to the external control signal comprising an externally-received mode register set code.

5. The device of claim 1, wherein the at least one pull-up resistive element has a same impedance as the at least one pull-down resistive element.

6. The device of claim 1, wherein the ODT circuit generates a plurality of ODT up and down signals for performing the ODT operation synchronously to an external clock, and wherein each of said unit drivers comprises:

a plurality of pull-up resistive elements each having a first end directly connected to the common node of said unit driver, a plurality of pull-down resistive elements each having a first end directly connected to the common node of said unit driver, a plurality of pull-up transistors each having a drain connected to a second end of a corresponding one of the pull-up resistive elements, a source connected to the power voltage, and a gate configured to respond to one of the ODT up signals, and at least one pull-down transistor having a drain connected to second end of a corresponding one of the pull-down resistive elements, a source connected to the ground voltage, and a gate configured to respond to one of the ODT down signals.

7. The device of claim 6, wherein at least two of the pull-up resistive elements have different impedances than each other.

8. The device of claim 7, wherein at least two of the pull-down resistive elements have different impedances than each other.

* * * * *